(12) United States Patent
Adams, Sr. et al.

(10) Patent No.: US 6,687,130 B2
(45) Date of Patent: Feb. 3, 2004

(54) INTEGRATED WEDGE LOCK AND ELASTIC MEMBER

(75) Inventors: Robert M. Adams, Sr., Pasadena, MD (US); Brent R. Pohl, Timonium, MD (US)

(73) Assignee: Corvis Corporation, Columbia, MD (US)

( * ) Notice: Subject to any disclaimer, the term of this patent is extended or adjusted under 35 U.S.C. 154(b) by 103 days.

(21) Appl. No.: 09/948,674

(22) Filed: Sep. 10, 2001

(65) Prior Publication Data

US 2003/0048618 A1 Mar. 13, 2003

(51) Int. Cl.[7] .................................................. H05R 1/14
(52) U.S. Cl. ..................... 361/740; 361/741; 361/679; 361/686; 361/174; 361/70 S
(58) Field of Search ................................. 361/740, 679, 361/741, 756, 686; 174/70 S

(56) References Cited

U.S. PATENT DOCUMENTS

| 4,528,615 A | 7/1985 | Perry | 361/386 |
|---|---|---|---|
| 4,819,713 A | 4/1989 | Weisman | 165/1 |
| 5,224,016 A | 6/1993 | Weisman et al. | 361/388 |
| 5,642,219 A | 6/1997 | Ogiya et al. | 359/341 |
| 5,809,820 A | 9/1998 | Morimoto | 72/225 |

OTHER PUBLICATIONS

AT&T Technical Journal: A Journal of the AT&T Companies, vol. 74, No. 1, Jan./Feb. 1995, 106 pages.

Primary Examiner—David Martin
Assistant Examiner—Hung Bui
(74) Attorney, Agent, or Firm—Harrity & Snyder LLP

(57) ABSTRACT

A retainer provides locking and compliance between components. In a first implementation, the retainer includes a non-compliant member and a compliant member. The non-compliant member is configured to expand in a first direction. The compliant member attaches to the non-compliant member and is configured to deflect forces applied to the non-compliant member in the first direction or a second direction opposite to the first direction. In a second implementation, the retainer includes a rail and a group of wedge segments configured to attach to the rail and expand in a first direction. At least one of the wedge segments includes an integrated spring element.

16 Claims, 14 Drawing Sheets

INTEGRATED WEDGE LOCK AND ELASTIC MEMBER

BACKGROUND OF THE INVENTION

1. Field of the Invention

The present invention relates generally to retainers and, more particularly, to systems and methods for integrating an elastic mechanism with a retainer.

2. Description of Related Art

Network devices commonly include non-compliant retainers, such as wedge locks, that lock circuit boards or other devices into position. When network devices are placed into an underwater (or high pressure) environment, the devices may be subject to stresses and strains that tend to alter their shape and size. The forces applied to the non-compliant retainers within these network devices as a result of the increased pressure may cause the non-compliant retainers to deform, thereby detracting from their effectiveness.

Accordingly, there is a need in the art for systems and methods that add compliance to non-compliant retainers.

SUMMARY OF THE INVENTION

Systems and methods consistent with the present invention address this and other needs by combining the features of a wedge lock or retainer for processing modules with an elastic mechanism, such as a coil spring, elastomer, integral spring element, or linear wave spring, in order to provide both locking and compliance between components.

In accordance with the principles of this invention as embodied and broadly described herein, an optical processing device includes a frame, at least one processing module that amplifies an optical signal received by the optical processing device, and a retainer that is positioned between the processing module and the frame. The retainer includes a rail, a wedge lock configured to attach to the rail and expand in a first direction, and an elastic mechanism attached to the wedge lock and configured to deflect forces applied to the wedge lock in one of the first direction and a second direction opposite to the first direction.

In another implementation consistent with the present invention, a retainer includes a non-compliant member and a compliant member. The non-compliant member is configured to expand in a first direction. The compliant member attaches to the non-compliant member and is configured to deflect forces applied to the non-compliant member in the first direction or a second direction opposite to the first direction.

In yet another implementation consistent with the present invention, a method of manufacturing a deflectable wedge lock is provided. The method includes providing a wedge lock that includes a group of wedge lock segments and attaching one or more elastic mechanisms to the wedge lock to reduce forces applied to the wedge lock.

In a further implementation consistent with the present invention, a retainer includes a rail and a group of wedge segments configured to attach to the rail and expand in a first direction. At least one of the wedge segments includes an integrated spring element.

In yet a further implementation consistent with the present invention, a method of manufacturing a deflectable wedge lock includes providing a rail and mounting a group of wedge lock segments onto the rail. At least one of the wedge lock segments includes an integrated spring element configured to deflect forces applied to the deflectable wedge lock.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and equivalents.

Implementations consistent with the present invention provide a deflectable wedge lock design. In exemplary embodiments, the deflectable wedge lock design is configured by associating a coil spring, elastomeric material, integral spring element, or a linear wave spring with a wedge lock in order to provide both locking and compliance between segments retained by the deflectable wedge lock. Such a configuration is particularly attractive to devices that are mounted within a structure that is known to deflect during use, such as within a pressure vessel.

Exemplary System Configuration

Figure 1:
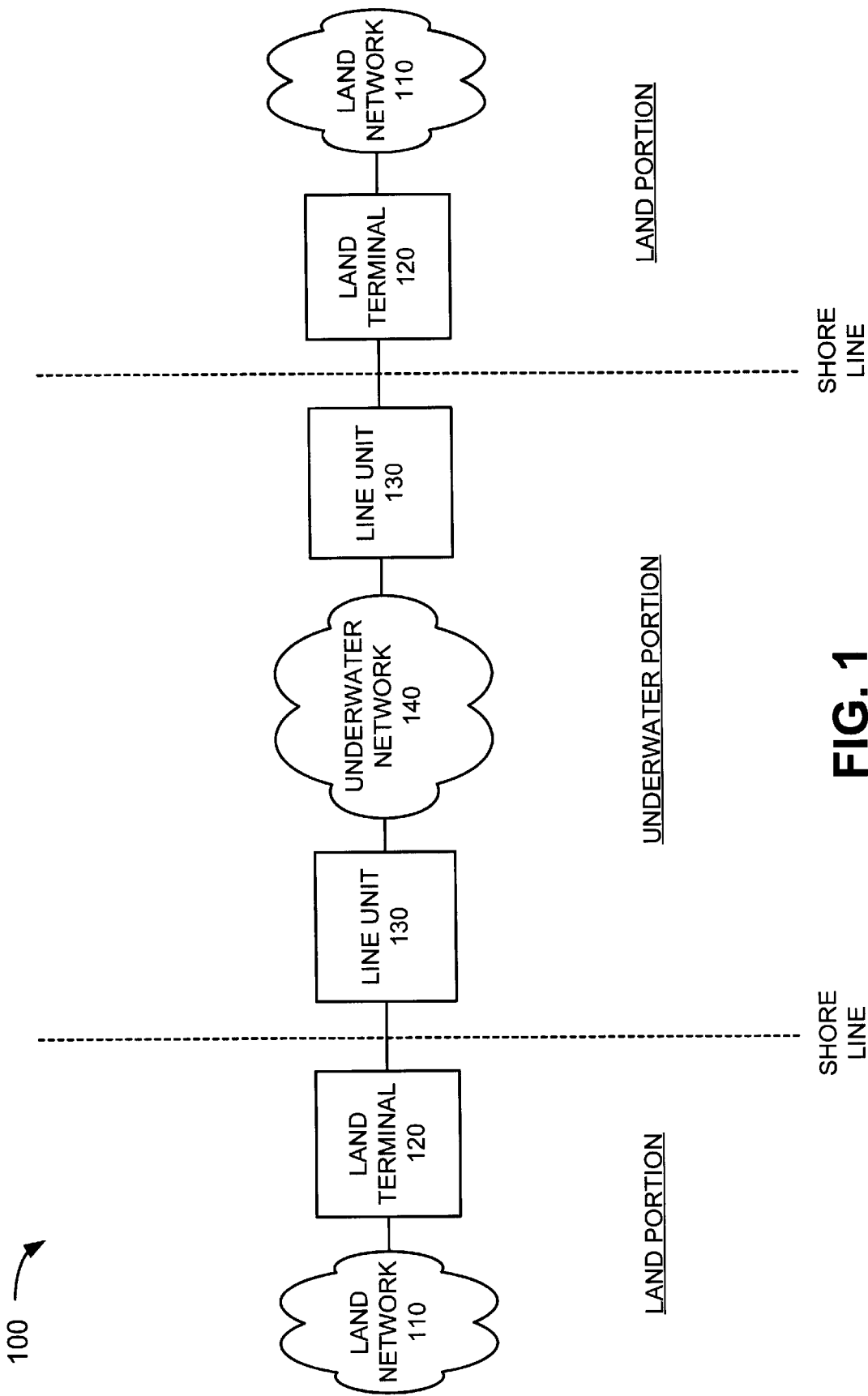
FIG. 1 illustrates an exemplary system in which systems and methods consistent with the present invention may be implemented.

FIG. 1 illustrates an exemplary system 100 in which systems and methods consistent with the present invention may be implemented. As illustrated, system 100 includes two land communication portions that are interconnected via an underwater communication portion. The land portions may include land networks 110 and land terminals 120. The underwater portion may include line units 130 and an underwater network 140. Two land networks 110, land terminals 120, and line units 130 are illustrated for simplicity. It will be appreciated that a typical system may include more or fewer devices and networks than are illustrated in FIG. 1. Line units 130 are sometimes referred to as "repeaters."

The land network 110 may include one or more networks, such as the Internet, an intranet, a wide area network (WAN), a local area network (LAN), or another type of network. Land terminals 120 include devices that convert signals received from the land network 110 into optical signals for transmission to the line unit 130, and vice versa. The land terminals 120 may connect to the land network 110 via wired, wireless, or optical connections. In an implementation consistent with the present invention, the land terminals 120 connect to the line units 130 via an optical connection.

The land terminals 120 may include, for example, long reach transmitters/receivers that convert signals into an optical format for long haul transmission and convert underwater optical signals back into a format for transmission to the land network 110. The land terminals 110 may also include wave division multiplexers and optical conditioning units that multiplex and amplify optical signals prior to transmitting these signals to line units 130, and line current equipment that provides power to the line units 130 and underwater network 140.

The underwater network 140 may include groups of line units and/or other devices capable of routing and amplifying optical signals in an underwater environment. The line units 130 include devices capable of receiving optical signals and transmitting these signals to other line units 130 via the underwater network 140.

Figure 2:
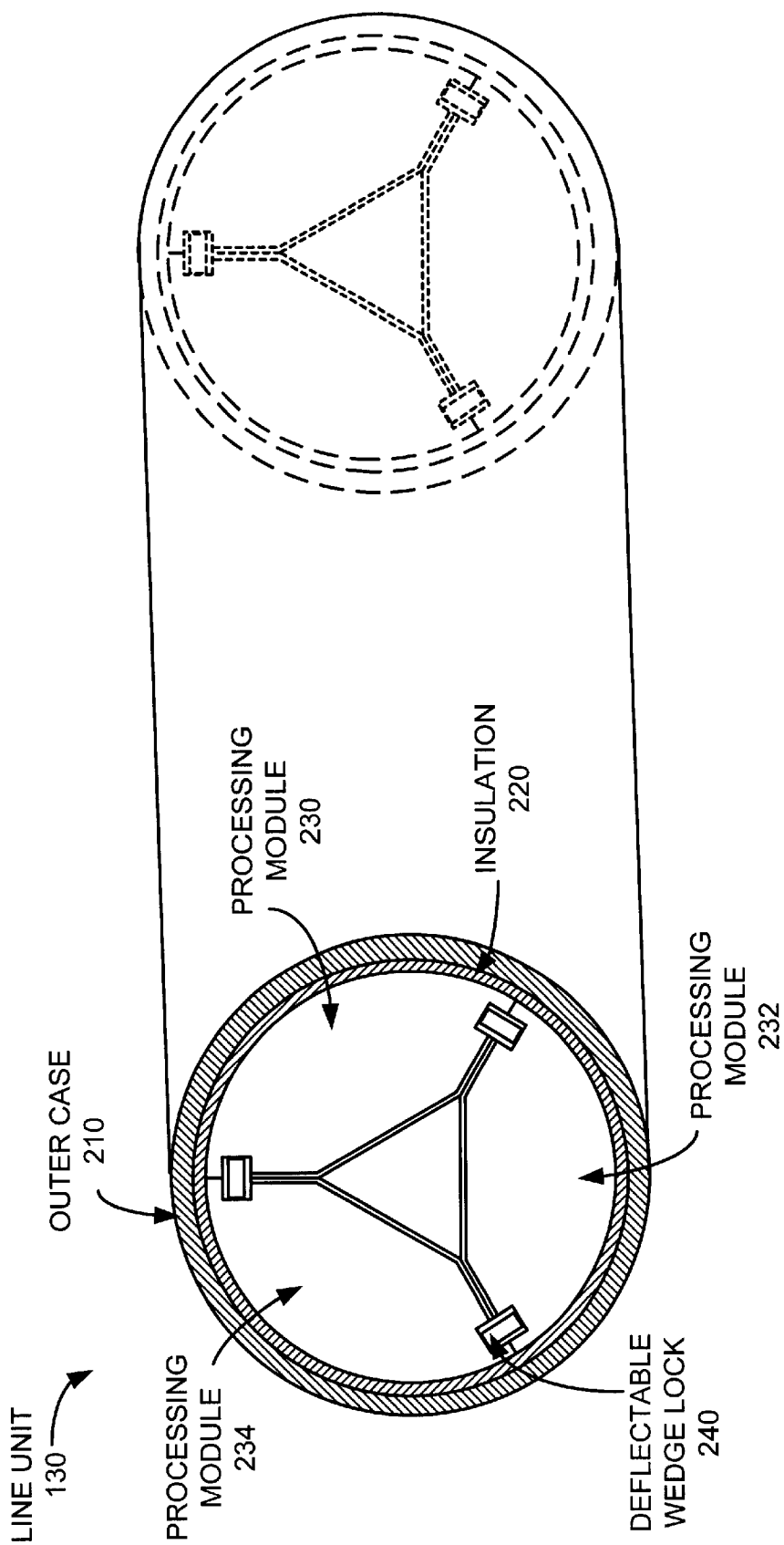
FIG. 2 illustrates an exemplary configuration of the line unit of FIG. 1.

FIG. 2 illustrates an exemplary configuration of the line unit 130 of FIG. 1. As illustrated, the line unit 130 may include an outer case 210, an insulating layer 220, groups of processing modules 230–234, and deflectable wedge locks 240. It will be appreciated that a typical line unit 130 may include other devices (not shown) that aid in the reception, processing, or transmission of optical signals. Moreover, although the exemplary implementation of FIG. 2 portrays line unit 130 as having three processing modules, those skilled in the art will appreciate that the present invention is applicable to line units (or other devices) having any number of processing modules (i.e., four, or more or less than three) that are secured to a frame.

The outer case 210 holds the electronic circuits needed for receiving and transmitting optical signals to other line units 130 and land terminals 120. The outer case 210 provides the electronic circuits with a pressure or watertight environment. As illustrated, the outer case 210 may be of a hollow cylindrical shape. Alternative configurations are also possible.

The outer case 210 may be fabricated of a high strength material, such as beryllium copper, titanium, nickel-based alloys, stellite, or the like. In an underwater or undersea environment, such a material should be chosen that provides good heat transfer characteristics for dissipating heat from inside the line unit 130 to the surrounding water.

The insulation layer 220 electrically isolates the electronic circuits and circuit mountings within the line unit 130 from the outer case 210. The insulator 220 may be applied uniformly to the inside of the outer case 210 to a thickness to withstand expected high voltage within the line unit 130, but limited from any excessive thickness to maximize heat transfer through the insulator 220.

The processing modules 230–234 may include electronic circuits for receiving, processing, and transmitting optical signals and circuit mountings. The circuit mountings act as a heat sink for the electronic circuits and as a heat conduit to the insulation layer 220. The circuit mountings may be fabricated out of a high conductivity material, such as aluminum. The contoured, or curved, surfaces of the processing modules 230–234 may be shaped to fit snugly against the inside, or exposed, side of the layer of insulation 220. The processing modules 230–234 may be positioned so that free space exists between adjacent ones of them, allowing them to be free of stress when the line unit 130 is in a high pressure location (e.g., at sea bottom).

The deflectable wedge locks 240 ensure separation between the processing modules 230–234 and ensure that the processing modules 230–234 and layer of insulation 220 remain in intimate contact, regardless of whether the line unit 130 expands or contracts as a result of changes in pressure. Keeping the processing modules 230–234 in intimate contact with the insulator 220 assures good thermal conductivity.

Figure 3:
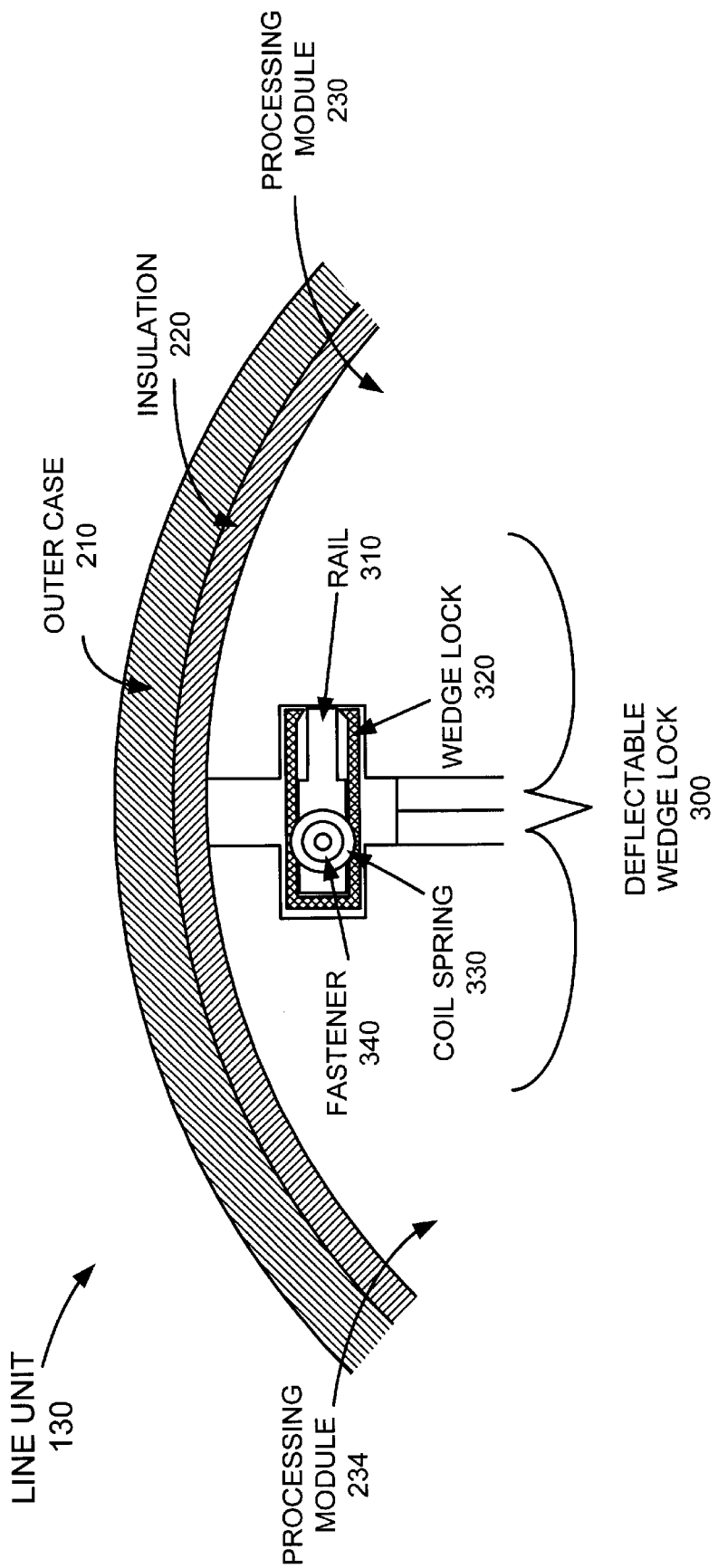
FIG. 3 illustrates an exemplary cross sectional view of a deflectable wedge lock in an implementation consistent with the present invention.

FIG. 3 illustrates an exemplary cross sectional view of a deflectable wedge lock 300 in an implementation consistent with the present invention. As illustrated, the deflectable wedge lock 300 includes a rail 310, a wedge lock 320, a coil spring 330, and a fastener 340.

The rail 310 allows for mounting of the wedge lock 320. The length and composition of the rail 310 may be selected so as to ensure that the deflectable wedge lock 300 is capable of performing the functions described above. In one implementation consistent with the present invention, the length of the rail 310 may be approximately equal to the length of the line unit 130. The rail 310 may be configured to have a "T" bar-like cross-section along its length. Such a configuration allows the rail 310 to retain the wedge lock 320 once the wedge lock 320 is in place. Other configurations may alternatively be used (e.g., two deflectable wedge locks each extending along approximately half the length of a processing module). The rail 310 may be securely mounted to the processing module 230 via screws, adhesives, rivets, or the like. Alternatively, the rail 310 may be securely mounted to a frame of the line unit 130.

As will be described in additional detail below, the wedge lock 320 may include several wedge lock segments. These segments may be of such a configuration as to allow the wedge lock 320 to be slid over the rail 310 and expand and contract in a well-known manner. The wedge lock 320 may be composed of aluminum or other similar types of heat conductive materials.

The coil spring 330 may be positioned between the wedge lock 320 and the fastener 340. The coil spring 330 allows the wedge lock 320 to retain its locking position despite deformations to the line unit 130 caused, for example, by changes in pressure (or other external forces). The coil spring 330 may be sized to provide the amount of force needed to constrain the wedge segments, while also providing the necessary tension needed to accommodate deformations in the line unit 130. The ability to provide compliance comes from the amount of travel provided by the coil spring. Coil spring 330 may, for example, have an amount of travel (i.e., the difference between the free height and fully compressed height of the coil spring) of more than 0.1 or 0.2 inches and possibly as much or more than 0.5 inches. The fastener 340 may be a screw or other similar type of fastening device capable of applying pressure to the wedge lock 320 in order to compress the various wedge segments together and expand the wedge lock 320 to the desired height.

Figure 4:
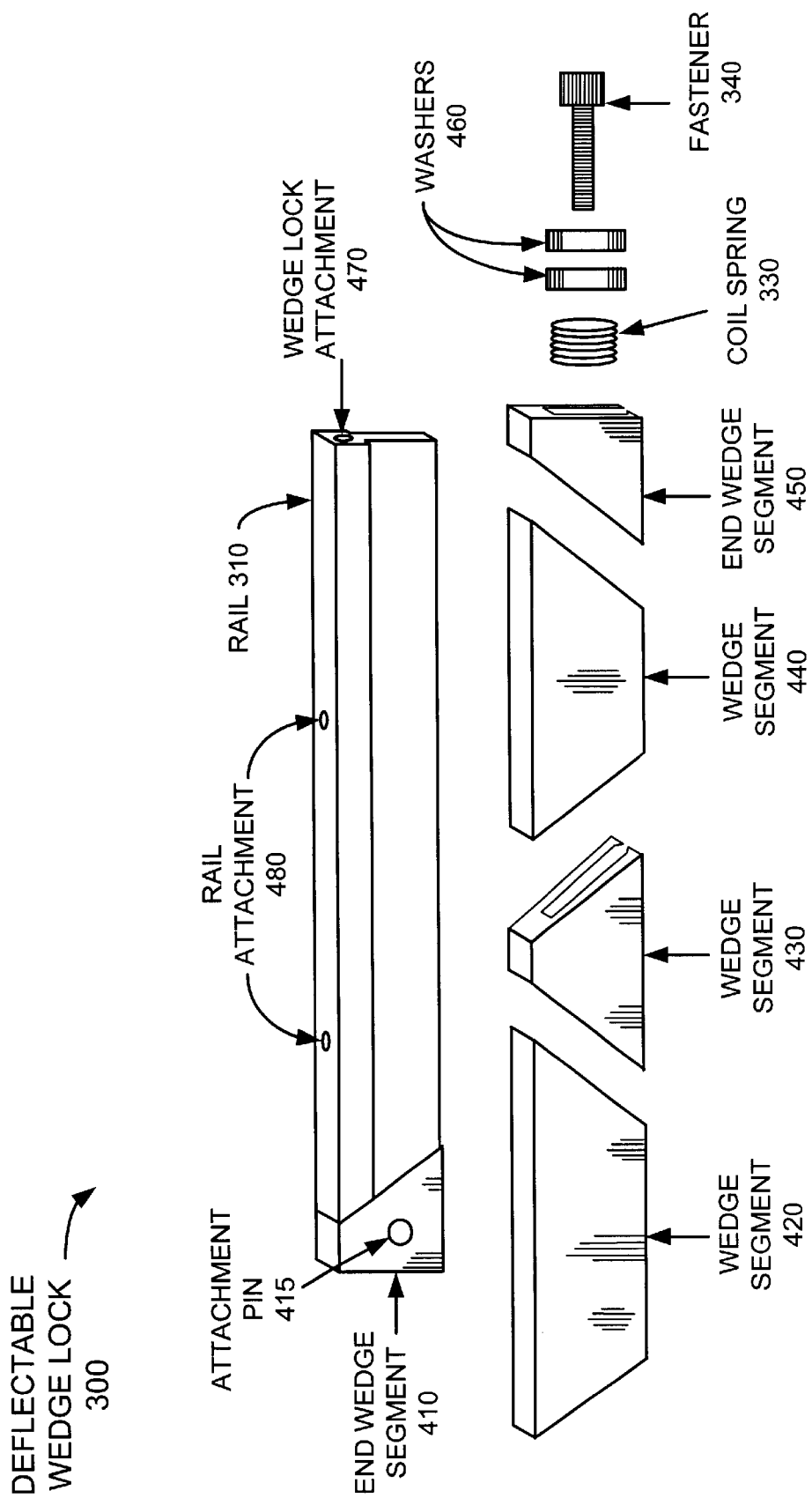
FIG. 4 illustrates an exemplary configuration of the deflectable wedge lock of FIG. 3 in greater detail.

FIG. 4 illustrates an exemplary configuration of the deflectable wedge lock 300 of FIG. 3 in greater detail. As illustrated, the deflectable wedge lock 300 includes a rail 310, wedge lock segments 410–450, a coil spring 330, washers 460, and a fastener 340. The rail 310, coil spring 330, and fastener 340 may be similar to those described above with respect to FIG. 3.

The wedge lock 320 may include five wedge segments 410–450. The wedge segments 410–450 may be configured to slide onto and mate with the rail 310 in a way that precludes the wedge segments 410–450 from becoming easily misaligned. In other words, the wedge segments 410–450 should not be able to rotate about the rail 310, or be removed from the rail 310 except by sliding them off an end of the rail 310. The wedge segments 410–450 may include ramped ends that allow the overall height of the wedge lock 320 to be adjusted once the segments 410–450 are positioned on the rail 310. The number of wedge segments, and the length of each wedge segment, may be varied in accordance with the type or size of deflectable wedge lock desired. The washers 460 may include any conventional type of washers.

The deflectable wedge lock 300 may be assembled in the following manner. The rail 310 may be attached to the processing module 230 (or other appropriate surface, such as a frame of the line unit 130). As illustrated, the rail 310 may include a group of attachment holes 480 that allow the rail 310 to be mounted to the processing module 230 via screws, rivets, and the like. Alternatively, the rail 310 may be mounted to the processing module 230 through the use of adhesives.

The end wedge segment 410 may be attached to the rail 310 via an attachment pin 415 or other similar type of mechanism. The end wedge segment 410 serves to retain the other wedge segments 420–450 on the rail 310. The end wedge segment 410 may be attached to the rail 310 prior to or after the rail 310 has been mounted to the processing module 230.

Once the end wedge segment 410 has been attached to the rail 310, the other wedge segments 420–440 and end wedge segment 450 may be slid onto the rail 310. As illustrated, the end wedge segment 450 may be configured with an unramped front end that allows the fastener 340 to apply pressure equally through the washers 460 and coil spring 330 to the wedge lock 320. The coil spring 330, washers 460, and fastener 340 should be locked in place so as to prohibit loosening during use. This may be accomplished, for example, through the use of a mechanical locking device or a thread-locking adhesive.

It will be appreciated that the number of washers 460 illustrated in FIG. 4 is provided for simplicity. In practice, the deflectable wedge lock 300 may include more or fewer washers than illustrated in FIG. 4. Moreover, the washers 460 may be positioned differently than illustrated in FIG. 4. For example, a washer 460 may be positioned between the coil spring 330 and the end wedge segment 450.

Figure 5:
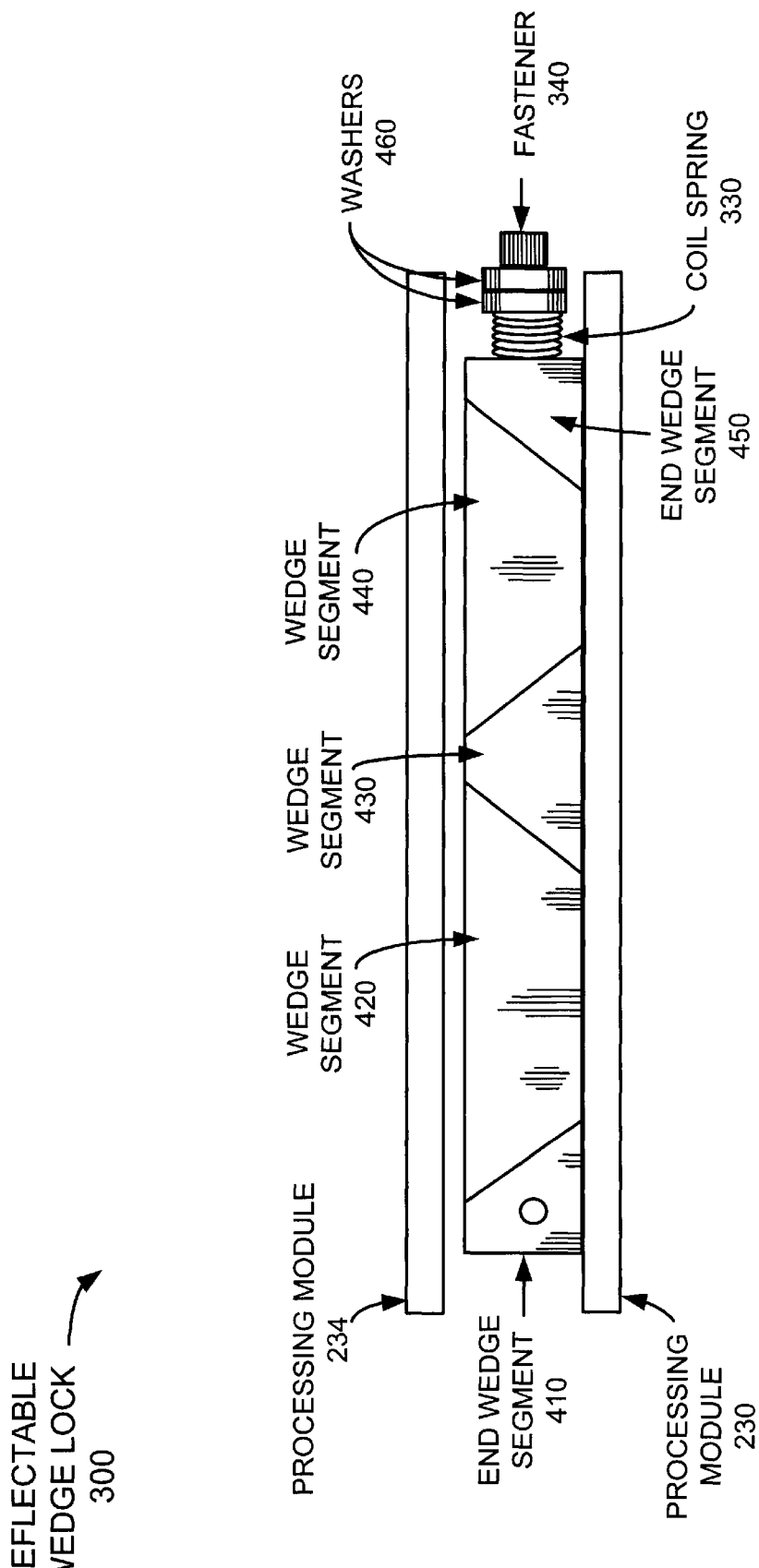
FIG. 5 illustrates the deflectable wedge lock of FIG. 3 in an assembled, uncompressed state.
Figure 6:
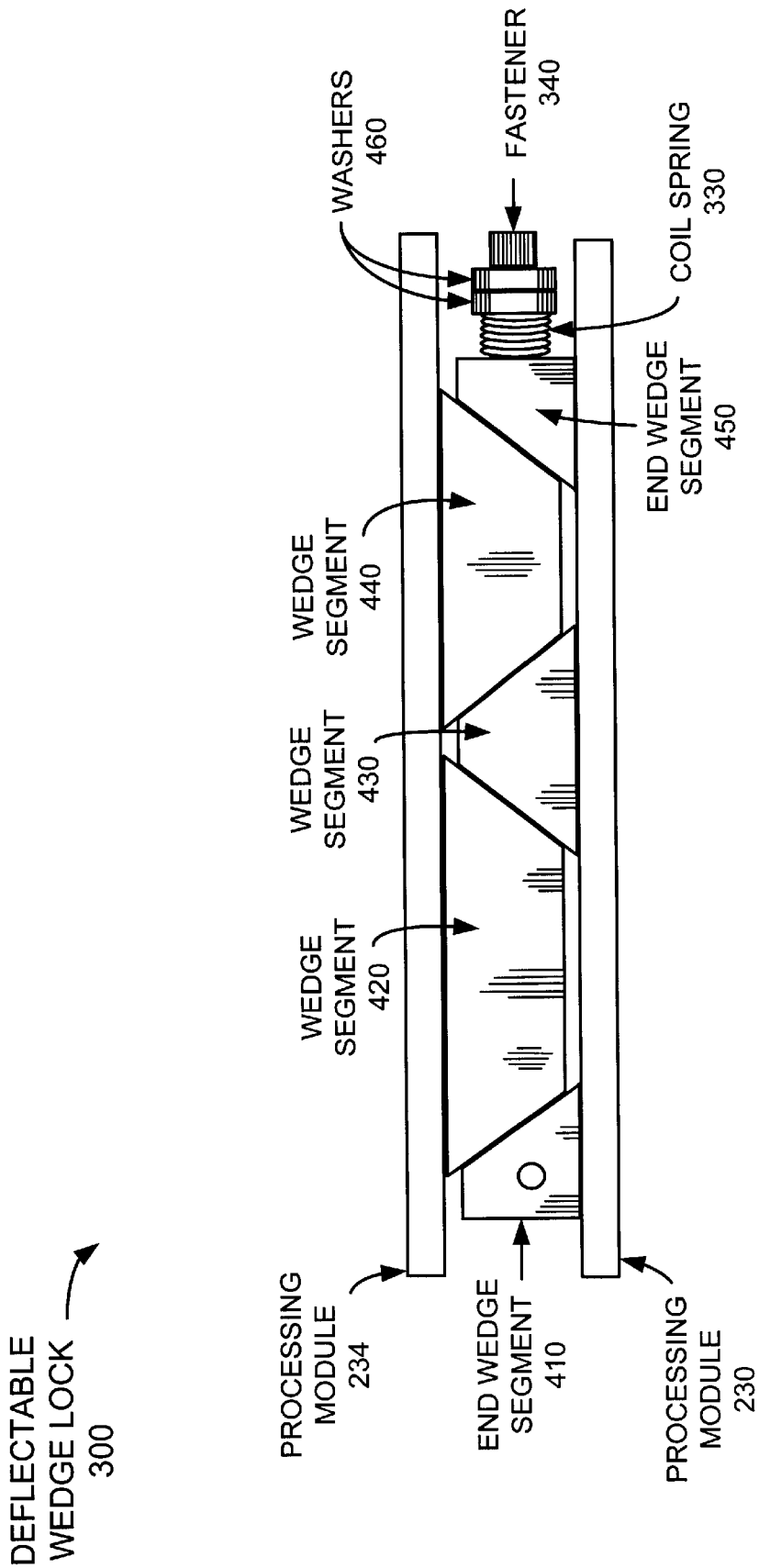
FIG. 6 illustrates the deflectable wedge lock of FIG. 3 in an assembled, compressed state.

Once the wedge segments 410–450 have been slid onto the rail 310, the fastener 340 may connect to the rail 310 via the wedge lock attachment opening 470 in a well-known manner. FIG. 5 illustrates the deflectable wedge lock 300 of FIG. 3 in an assembled, uncompressed state. As illustrated, when the deflectable wedge lock 300 is in an uncompressed state, a gap may exist between the deflectable wedge lock 300 and the processing module 234. By tightening the fastener 340, the deflectable wedge lock 300 expands to fill the gap, as illustrated in FIG. 6.

When the line unit 130 is positioned in an underwater environment (e.g., the bottom of the ocean), external pressure may cause the outer case 210 of the line unit 130 to contract. The deflectable wedge lock 300 may retain its compressed state (e.g., as illustrated in FIG. 6) by deflecting the forces applied by the external pressure to the coil spring 330. Such a configuration is contrary to conventional wedge locks, which are inflexible once placed into a compressed state.

Figure 7:
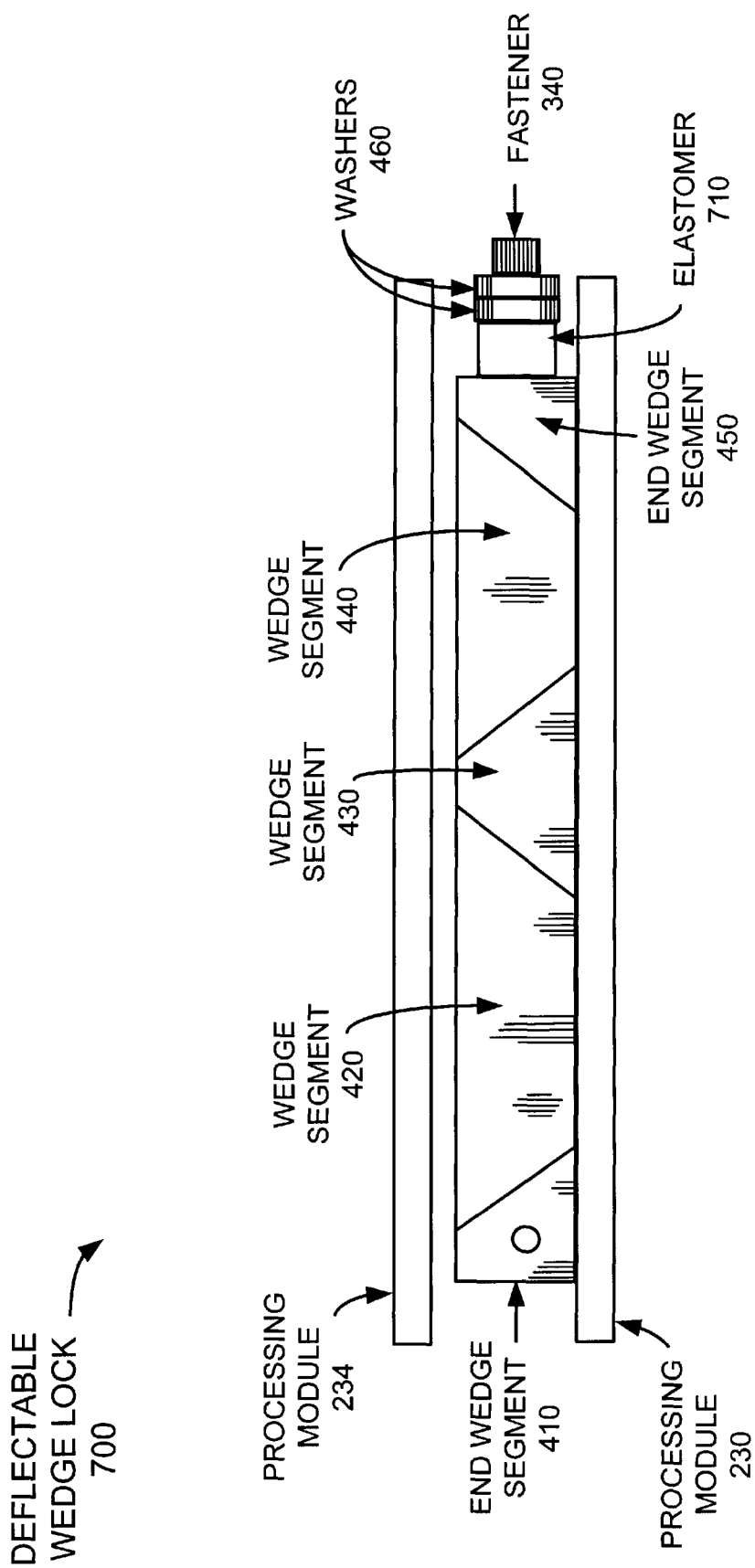
FIG. 7 illustrates an exemplary configuration of the deflectable wedge lock in another implementation consistent with the present invention.

FIG. 7 illustrates an exemplary configuration of the deflectable wedge lock 700 in another implementation consistent with the present invention. The deflectable wedge lock 700 is configured in a manner similar to that described above with respect to FIGS. 3–6, except that the coil spring 330 is replaced with an elastomer 710.

The elastomer 710 may include rubber or any other solid material having elastic properties similar to that of natural rubber, but, preferably, will be a material that will retain its level of elasticity over time. The elastomer 710 allows the wedge lock 320 to retain its locking position despite deformations to the line unit 130 caused, for example, by changes in pressure (or other external forces). Similar to the coil spring 330, the elastomer 710 may be incorporated with the existing wedge lock hardware used to cause the wedge lock to expand. The elastomer 710 may be sized to provide the amount of force needed to constrain the wedge segments, while also providing the necessary tension needed to accommodate deformations in the line unit 130.

Figure 8:
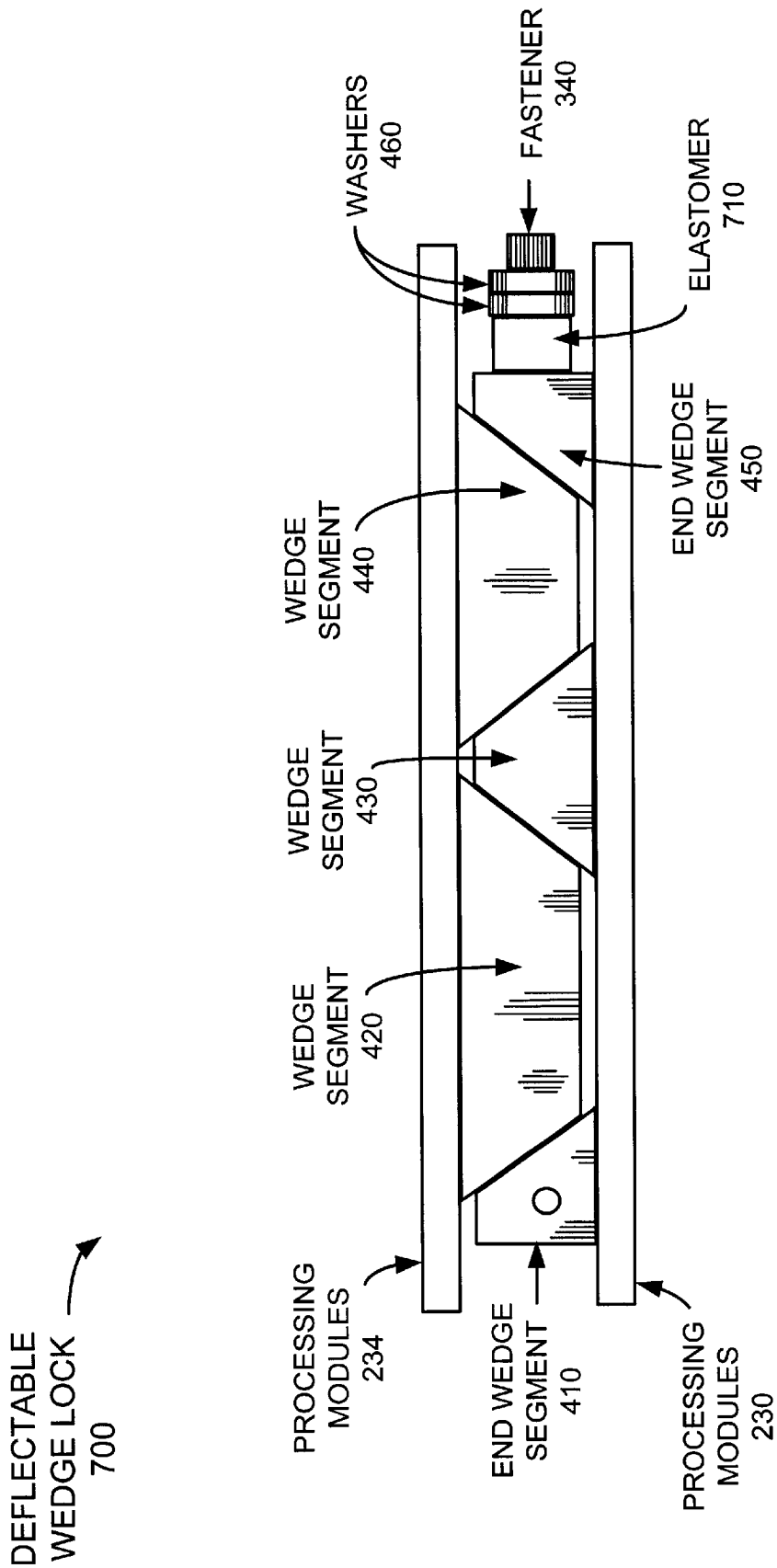
FIG. 8 illustrates the deflectable wedge lock of FIG. 7 in a compressed state.

In an uncompressed state, a gap exists between the deflectable wedge lock 700 and the processing module 234. By tightening the fastener 340, the deflectable wedge lock 700 expands to fill the gap, as illustrated in FIG. 8.

Figure 9:
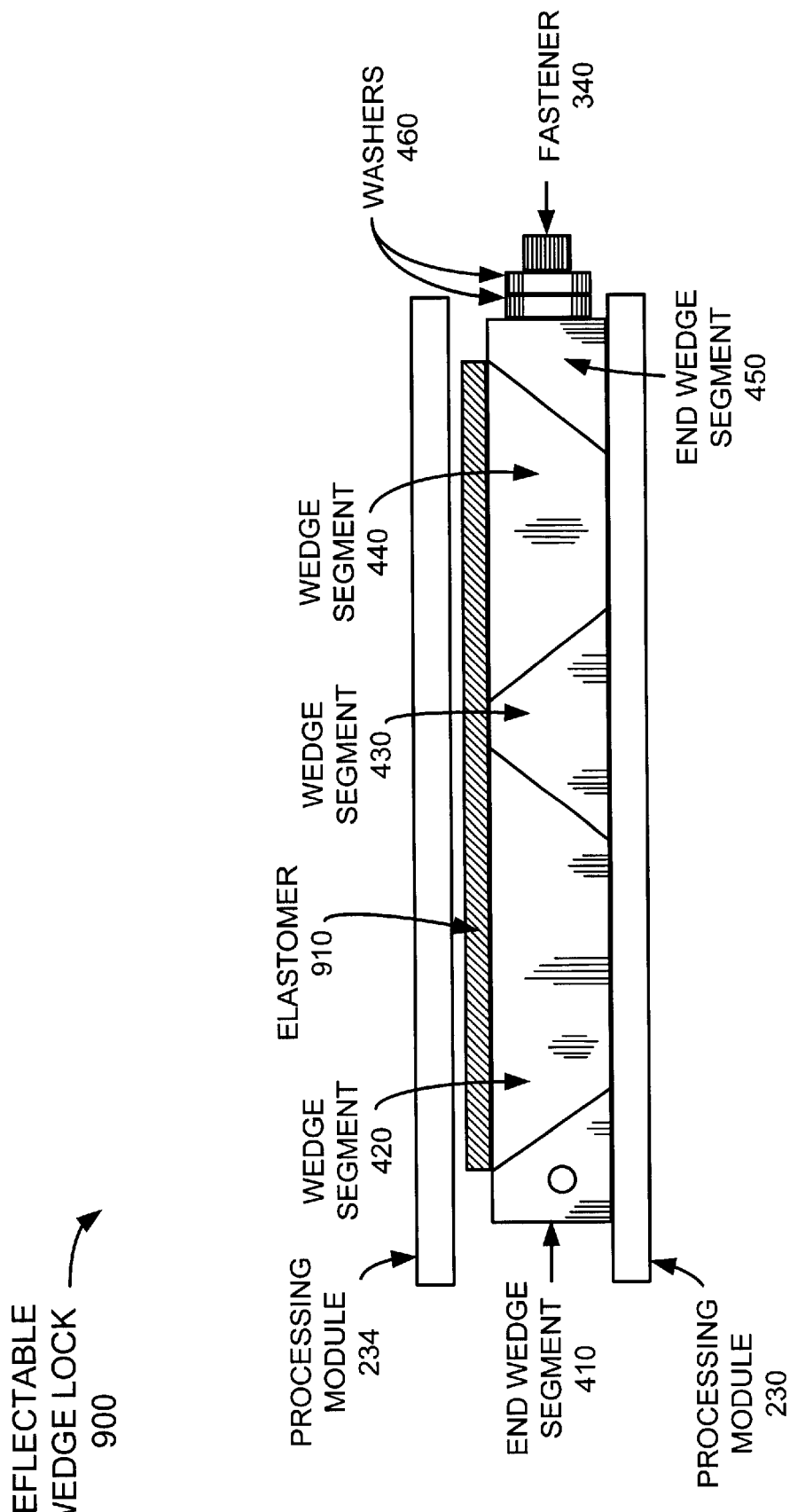
FIG. 9 illustrates an exemplary configuration of the deflectable wedge lock in yet another implementation consistent with the present invention.

FIG. 9 illustrates an exemplary configuration of the deflectable wedge lock 900 in yet another implementation consistent with the present invention. The deflectable wedge lock 900 is configured in a manner similar to that described above with respect to FIGS. 3–6. In this exemplary implementation, however, the coil spring 330 is eliminated and an elastomer 910 is positioned between the wedge segments 410–450 and the processing module 234.

The elastomer 910 may include rubber or any other solid material having elastic properties similar to that of natural rubber, while retaining its reactive force over time. The elastomer 910 allows the wedge lock to retain its locking position despite deformations to the line unit 130 caused, for example, by changes in pressure (or other external forces). The elastomer 910 may be attached to the wedge segments 410–450 via adhesives, epoxies, or other mechanisms based on the specific material used for the elastomer 910. In an alternative implementation, a separate elastomer may be attached to each of the wedge segments 410–450 or to some subset of the wedge segments 410–450.

Figure 10:
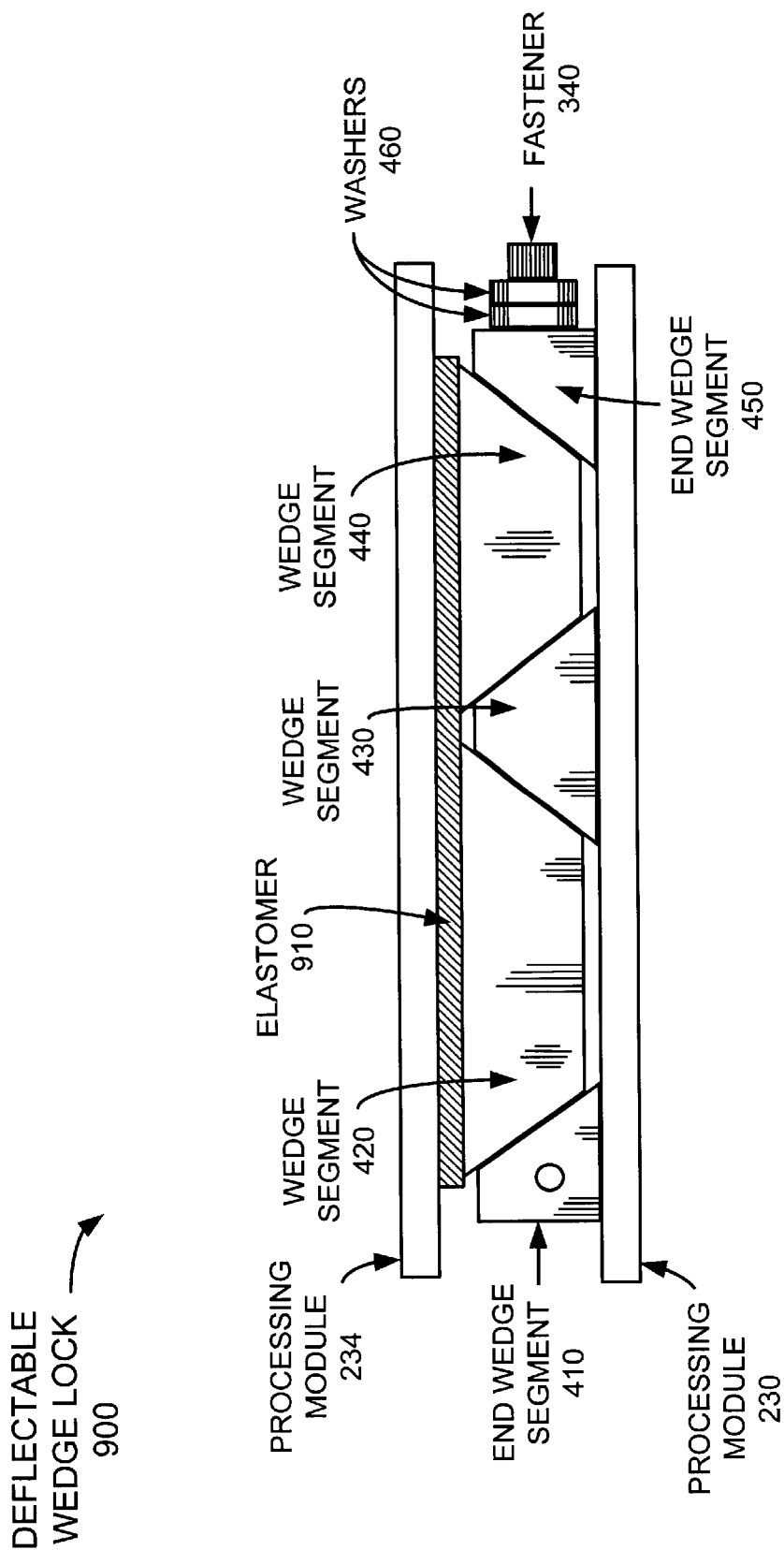
FIG. 10 illustrates the deflectable wedge lock of FIG. 9 in a compressed state.

FIG. 10 illustrates the deflectable wedge lock 900 in a compressed state. Once in the compressed state, any external forces applied to the deflectable wedge lock 900 may be absorbed by the elastomer 910.

Figure 11:
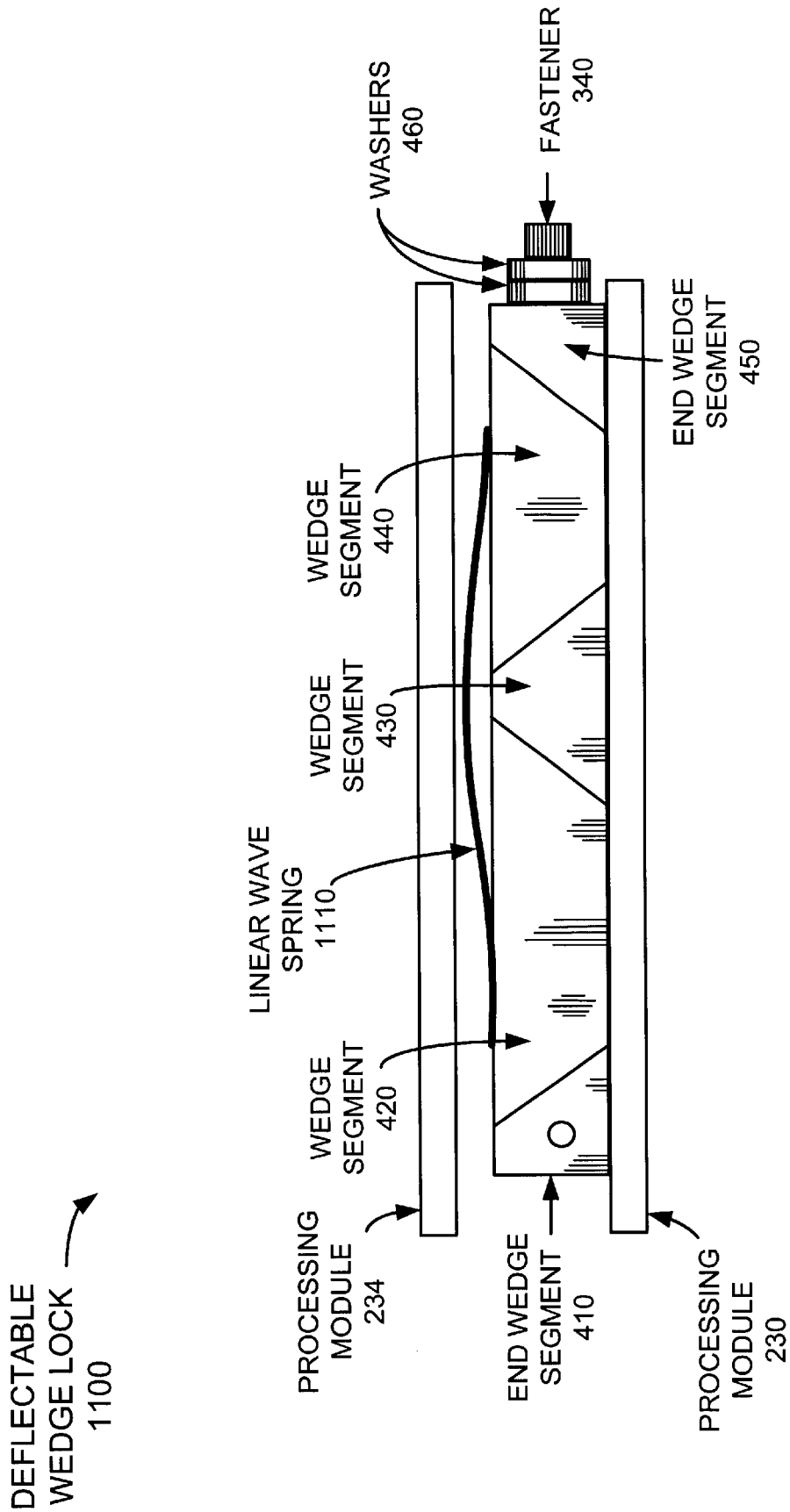
FIG. 11 illustrates an exemplary configuration of the deflectable wedge lock in a further implementation consistent with the present invention.

FIG. 11 illustrates an exemplary configuration of the deflectable wedge lock 1100 in a further implementation consistent with the present invention. The deflectable wedge lock 1100 is configured in a manner similar to that described above with respect to FIGS. 9 and 10. In this exemplary implementation, however, the elastomer 910 is replaced with a linear wave spring 1110.

The linear wave spring 1110 may include any type of conventional linear wave spring that allows the wedge lock to retain its locking position despite deformations to the line unit 130. As shown, linear wave spring 1110 includes a single wave; however, those skilled in the art will appreciate that linear spring 1110 could include two or more waves. The linear wave spring 1110 may include slots along its length that allow the linear wave spring 1110 to be attached to the wedge segments 410–450. For such a configuration, one or more of the wedge segments 410–450 may include tabs, fasteners, screws, or other mechanisms that extend up from the wedge segments 410–450 through the linear wave spring 1110. The linear wave spring attachment mechanism should be capable of constraining the linear wave spring 1110 while allowing it to expand longitudinally. In an alternative implementation, a separate linear wave spring may be attached to each of the wedge segments 410–450 or some subset of the wedge segments 410–450.

Figure 12:
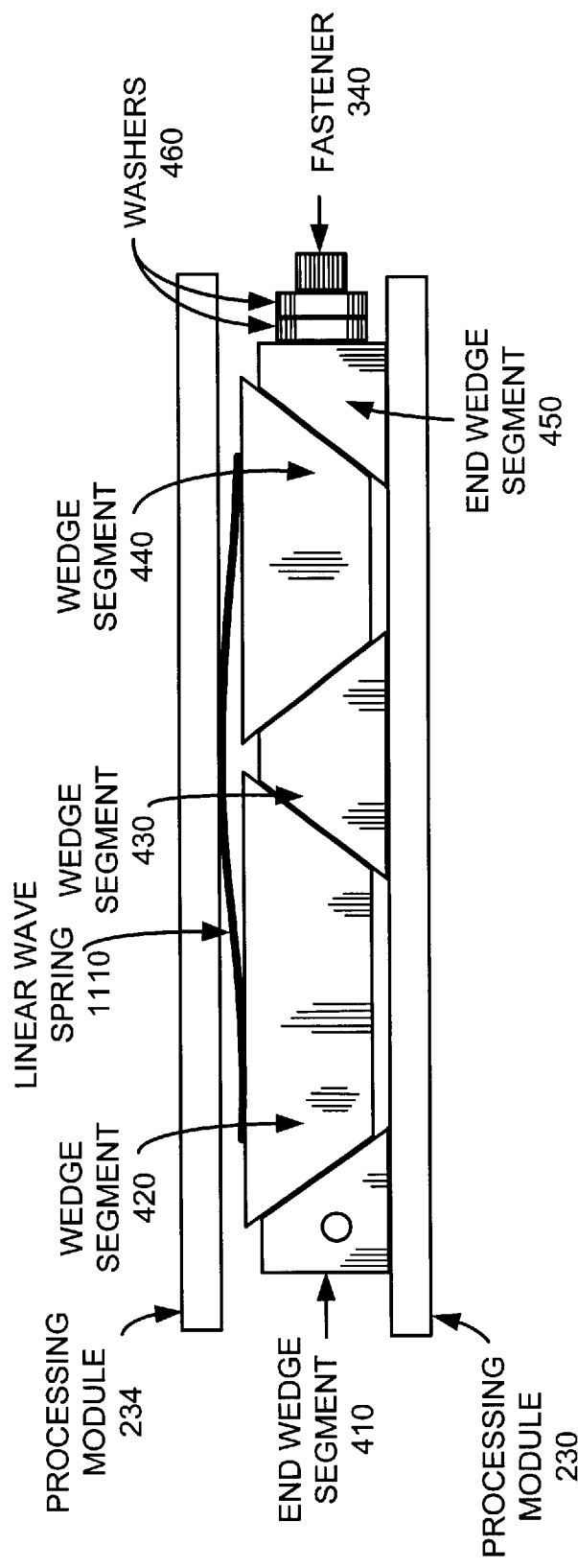
FIG. 12 illustrates the deflectable wedge lock of FIG. 11 in a compressed state.

FIG. 12 illustrates the deflectable wedge lock 1100 in a compressed state. Once in the compressed state, any external forces applied to the deflectable wedge lock 1100 may be absorbed by the linear wave spring 1110.

Figure 13:
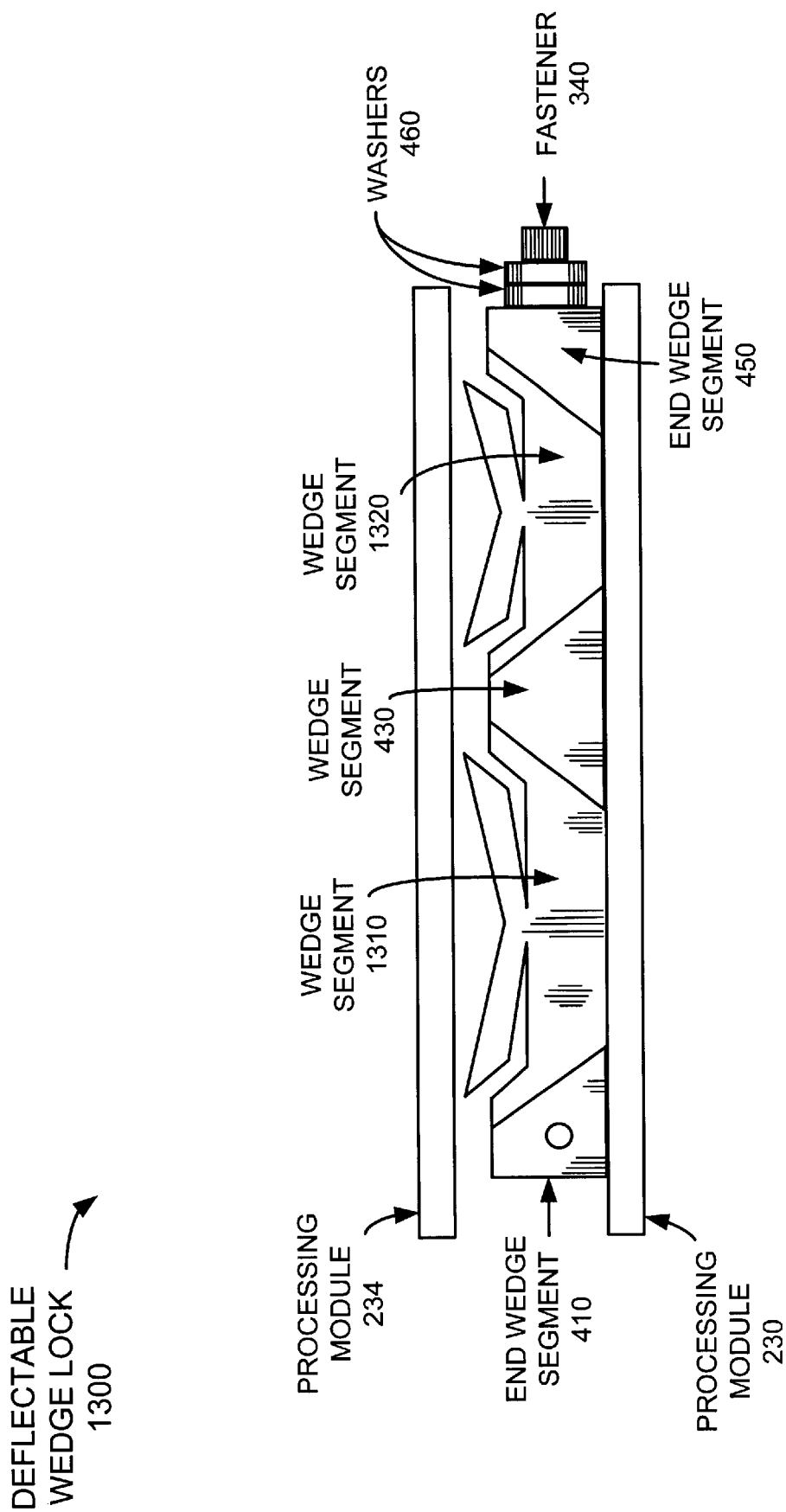
FIG. 13 illustrates an exemplary configuration of the deflectable wedge lock in yet a further implementation consistent with the present invention.

FIG. 13 illustrates an exemplary configuration of the deflectable wedge lock 1300 in yet a further implementation consistent with the present invention. In this exemplary implementation, a spring element is integrated into the wedge lock segments.

As illustrated, wedge segments 420 and 440 of FIG. 4 have been replaced with wedge segments 1310 and 1330 having one or more spring elements integrated therein. The integrated spring elements may be composed of any type of material that is strong enough to allow the wedge lock 1300 to retain its locking position, yet flexible enough to deflect external forces applied to the wedge lock 1300 in the expandable direction. These external forces may, for example, be the result of changes in pressure that causes the line unit 130 to deform.

Figure 14:
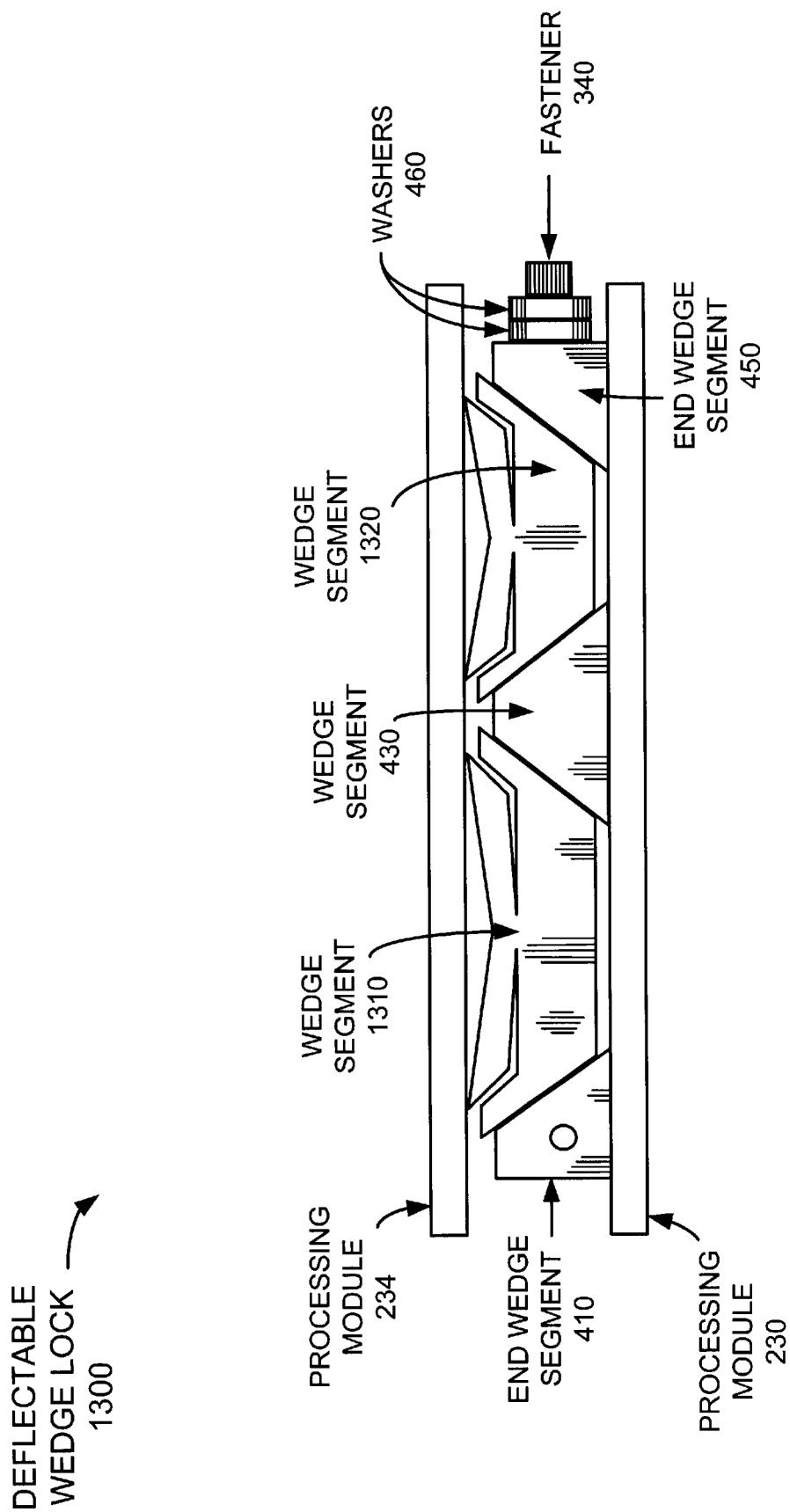
FIG. 14 illustrates the deflectable wedge lock of FIG. 13 in a compressed state.

FIG. 14 illustrates the deflectable wedge lock 1300 in a compressed state. Once in the compressed state, any external forces applied to the deflectable wedge lock 1300 may be absorbed by the wedge lock's integrated spring elements.

Conclusion

Systems and methods, consistent with the present invention, provide locking and compliance between processing modules in an underwater device. An elastic mechanism is associated with a wedge lock in order to deflect deformations and stresses applied to the underwater device as a result of changes in external pressure.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, while the deflectable wedge lock has been described as being associated with a coil spring, elastomer, integrated spring element, or linear wave spring, a combination of these devices or other elastic mechanisms, such as other types of springs, may alternatively be used. For example, the wedge lock could be associated with an adhesive or epoxy mixture that is cured in and/or around the wedge lock. In an alternative implementation, the insulating layer could attach to the wedge lock and serve as the elastic mechanism.

Moreover, while the above description focused on an underwater environment, implementations consistent with the present invention are not so limited. For example, the deflectable wedge lock could alternatively be implemented in ground-based, space, or aerospace environments.

No element, act, or instruction used in the description of the present application should be construed as critical or essential to the invention unless explicitly described as such. Also, as used herein, the article "a" is intended to include one or more items. Where only one item is intended, the term "one" or similar language is used.

The scope of the invention is defined by the claims and their equivalents.

What is claimed is:

1. An optical processing device comprising:

a frame;

at least one processing module configured to amplify an optical signal received by the optical processing device; and a retainer, positioned between the at least one processing module and the frame, comprising:
a rail,
a wedge lock configured to attach to the rail and expand in a first direction, and
an elastic mechanism attached to the wedge lock and configured to deflect forces applied to the wedge lock in one of the first direction and a second direction opposite to the first direction.

2. The optical processing device of claim 1 wherein the elastic mechanism includes a coil spring.

3. The optical processing device of claim 2 wherein the wedge lock includes a plurality of wedge segments, and wherein the coil spring attaches to an end wedge segment.

4. The optical processing device of claim 2 wherein a difference in a free height and a fully compressed height of the coil spring is at least 0.1 inches.

5. The optical processing device of claim 1 wherein the elastic mechanism includes an elastomer.

6. The optical processing device of claim 5 wherein the wedge lock includes a plurality of wedge segments, and wherein the elastomer attaches to an end wedge segment.

7. The optical processing device of claim 5 wherein the elastomer attaches between the wedge lock and the at least one processing module.

8. The optical processing device of claim 5 wherein the wedge lock includes a plurality of wedge segments, and wherein the elastomer includes at least two segments, each segment attached to one of the plurality of wedge segments.

9. The optical processing device of claim 1 wherein the elastic mechanism includes a linear wave spring.

10. The optical processing device of claim 9 wherein the linear wave spring attaches between the wedge lock and the at least one processing module.

11. The optical processing device of claim 9 wherein the wedge lock includes a plurality of wedge segments, and wherein the linear wave spring includes at least two segments, each segment attached to one of the plurality of wedge segments.

12. The optical processing device of claim 1 wherein the rail attaches to the at least one processing module.

13. The optical processing device of claim 1 wherein the rail attaches to the frame.

14. The optical processing device of claim 1 wherein the optical processing device is an underwater repeater.

15. The optical processing device of claim 1 further comprising:

an outer case; and an insulating layer connected to an inside of the outer case.

16. The optical processing device of claim 15 wherein the retainer is configured to push the at least one processing module against the insulating layer to allow for heat dissipation.

* * * * *

UNITED STATES PATENT AND TRADEMARK OFFICE
CERTIFICATE OF CORRECTION

PATENT NO. : 6,687,130 B2
DATED : February 3, 2004
INVENTOR(S) : Robert M. Adams, Sr.

It is certified that error appears in the above-identified patent and that said Letters Patent is hereby corrected as shown below:

<u>Title page,</u>
Item [75], Inventors, should read:
-- Robert M. Adams, Sr., Pasadena MD (US) --

Signed and Sealed this

Eleventh Day of May, 2004

JON W. DUDAS
*Acting Director of the United States Patent and Trademark Office*